(12) United States Patent
Gardner et al.

(10) Patent No.: US 6,177,687 B1
(45) Date of Patent: *Jan. 23, 2001

(54) SEMICONDUCTOR DEVICE HAVING GATE ELECTRODE SHARED BETWEEN TWO SETS OF ACTIVE REGIONS AND FABRICATION THEREOF

(75) Inventors: Mark I. Gardner, Cedar Creek; H. Jim Fulford, Austin, both of TX (US)

(73) Assignee: Advanced Micro Devices, Sunnyvale, CA (US)

( * ) Notice: Under 35 U.S.C. 154(b), the term of this patent shall be extended for 0 days.

This patent is subject to a terminal disclaimer.

(21) Appl. No.: 09/201,995

(22) Filed: Dec. 1, 1998

(51) Int. Cl.[7] .................... H01L 29/16; H01L 31/036; H01L 31/112
(52) U.S. Cl. .................. 257/67; 287/368; 287/288; 287/250
(58) Field of Search .................... 257/368, 250, 257/366, 316, 326, 67, 69, 288, 270

(56) References Cited

U.S. PATENT DOCUMENTS

| | | |
|---|---|---|
| 4,654,121 * | 3/1987 | Miller et al. . |
| 4,686,758 * | 8/1987 | Liu et al. . |
| 5,215,932 | 6/1993 | Manning . |
| 5,310,696 | 5/1994 | McCann et al. . |
| 5,324,960 * | 6/1994 | Pfiester et al. . |
| 5,714,394 | 2/1998 | Kadosh et al. . |
| 5,757,047 * | 5/1998 | Nakamura . |
| 5,843,816 * | 12/1998 | Liaw et al. ............... 438/238 |
| 5,852,310 * | 12/1998 | Kadosh et al. . |
| 5,882,959 * | 3/1999 | Kadosh et al. ............ 438/512 |
| 5,939,749 * | 8/1999 | Taketa et al. ............. 257/316 |
| 5,949,092 * | 9/1999 | Kadish et al. . |

FOREIGN PATENT DOCUMENTS

WO 93/09567 * 5/1993 (WO) ................... 257/366

* cited by examiner

Primary Examiner—Sheila V. Clark

(57) ABSTRACT

Semiconductor devices having a gate electrode shared by two sets of active regions and methods of manufacture thereof are provided. In one embodiment, a first substrate is provided and a gate electrode is disposed over the first substrate. A second substrate is disposed over the gate electrode. A first set of active regions is disposed in portions of the first substrate adjacent the gate electrode and a second set of active regions is disposed above the gate electrode and adjacent the second substrate. The two sets of active regions may be coupled together or used separately.

22 Claims, 6 Drawing Sheets

US 6,177,687 B1

SEMICONDUCTOR DEVICE HAVING GATE ELECTRODE SHARED BETWEEN TWO SETS OF ACTIVE REGIONS AND FABRICATION THEREOF

FIELD OF THE INVENTION

The present invention is directed generally to semiconductor devices and, more particularly, to a semiconductor device having a gate electrode shared between two sets of active regions and a method fabricating such as device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). The typical MOS transistor is symmetrical, which means that the source and drain are interchangeable. Whether a region acts as a source or drain depends on the respective applied voltages and the type of device being made (e.g., PMOS, NMOS, etc.).

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The gate insulating layer 109 is provided to prevent current from flowing between the gate electrode 103 and the source/drain regions 105 or channel region 107.

After the source/drains 105 have been formed, a relatively thick oxide layer (not shown), referred to as a contact formation layer, is disposed over the substrate 101. Openings are generally cut into the contact formation layer to expose the source/drain regions 105 and the surface of the gate electrode 103. The exposed areas are then filled with a metal, such as tungsten, to form contacts which are used to connect the active elements with other devices on the chip.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

SUMMARY OF THE INVENTION

Generally, the present invention provides semiconductor devices having a gate electrode shared by two sets of active regions and methods of manufacture thereof. In accordance with one embodiment of the invention, a semiconductor device is formed by forming a gate electrode above a first substrate and below a second substrate, forming a first set of active regions below the gate electrode and associated with the first substrate, and forming a second set of active regions above the gate electrode and associated with the second substrate. The two sets of active regions may, for example, be used separately to effectively form two transistors. The two sets of active regions may, alternatively, be coupled to effectively form a single transistor.

A semiconductor device, according to another embodiment, includes a first substrate and a gate electrode disposed over the first substrate. A second substrate is disposed over the gate electrode. A first set of active regions is disposed in portions of the first substrate adjacent the gate electrode and a second set of active regions is disposed above the gate electrode and adjacent the second substrate. As noted above, the two sets of active regions may, for example, be used separately or coupled together.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
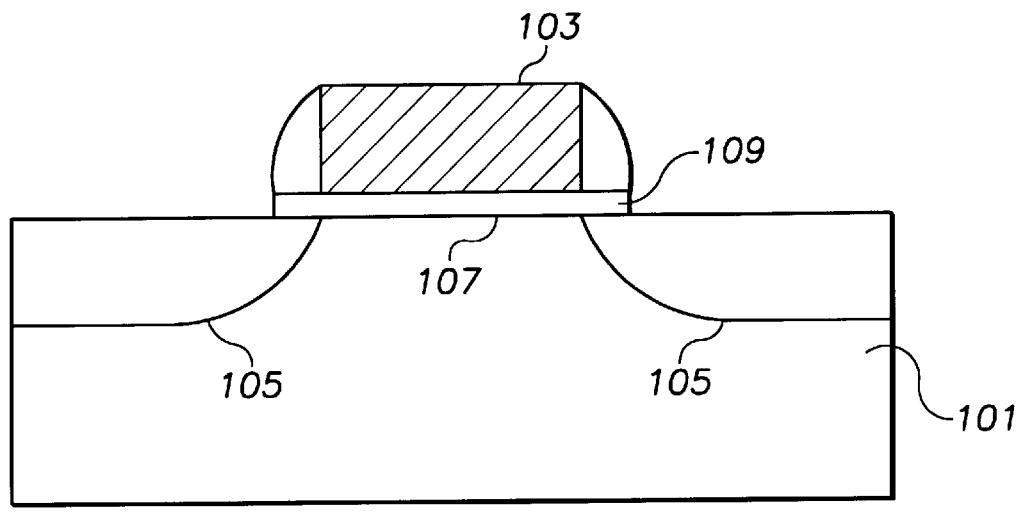
FIG. 1 illustrates a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to the fabrication of a number of semiconductor devices, including in particular MOS, CMOS, and BiCMOS structures. The invention is particularly suited for increasing the density of transistors on a chip. While the present invention is not so limited, an appreciation of various aspects of the invention will be gained through a discussion of the fabrication process and characteristics of such a device in connection with the examples provided below.

FIGS. 2A–2F illustrate an exemplary process for fabricating a semiconductor device having a gate electrode shared by two sets of active regions. In this exemplary process, a first gate insulating layer 203 is formed over a first substrate 201. The first substrate 201 is typically formed from a semiconductor material, such as silicon. The first gate insulating layer 203 may be formed a number of different insulating materials using, for example, well-known deposition or growth techniques. Suitable materials include, for example, oxides, such as silicon dioxide or higher permittivity metal oxides, such as titanium dioxide.

The first gate insulating layer 203 will be used to separate a gate electrode from the first substrate 201. The thickness of the first gate insulating layer 203 is typically selected based on the desired operational characteristics of the device being formed, taking into consideration the permittivity of the gate insulating layer. For many applications, thicknesses of this layer are selected to provide a capacitance equivalent to that of 10 to 25 angstroms (Å) of $SiO_2$.

Prior to forming the first gate insulating layer 203, dopants are typically provided in the first substrate 201 to form a voltage threshold region near the upper surface of the first substrate 201, to form a punchthrough region beneath the threshold region (typically about the same depth as later formed active regions), and to optionally form a well region in the substrate 201. Background dopants may be provided using, for example known implantation techniques. The conductivity type of the background dopants are typically similar and depend on the type of transistor being formed. For an NMOS or n-channel transistor, the background dopants are typically p-type, while for a PMOS or p-channel device, n-type background dopants are typically used.

A gate electrode layer 205 is formed over the first insulating layer 203. The gate electrode layer 205 may be formed from polysilicon or metal using, for example, known deposition techniques. When formed of polysilicon, the gate electrode layer 205 may be doped in-situ or after deposition using suitable diffusion or implantation techniques. The gate electrode layer 205 will be used to form a gate electrode for two sets of active regions. The thickness of the gate electrode layer 205 is typically selected in consideration of the desired thickness of the gate electrode. Suitable thicknesses range from 5000 to 10000 Å for many applications.

A second gate insulating layer 207 is formed over the gate electrode layer 205. The second gate insulating layer 207 may be formed from a number of different insulating materials using, for example, well-known deposition or growth techniques. Suitable materials include oxides, such as silicone dioxide, or metal oxides, such as titanium dioxide. The second gate insulating layer 207 will be used to separate a gate electrode from a second substrate and has a thickness typically selected based on the desired operational characteristics of the device being formed and the permittivity of the layer. For many applications, thicknesses of this layer are selected to provide a capacitance equivalent to that of 10 to 25 Å of $SiO_2$.

A second substrate layer 209 is formed over the second gate insulating layer 207. The second substrate layer 209 may, for example, be formed from a silicon using, for example, known deposition techniques. For instance, the second substrate layer 209 may be formed from polysilicon using a chemical vapor deposition (CVD) or low pressure chemical vapor deposition (LPCVD) technique. Typically, the second substrate layer 209 is formed in an undoped state and provided with appropriate doping in later processing. The second substrate layer 209 will be used as an upper substrate associated with a gate electrode formed from the gate electrode layer 205. The thickness of the second substrate layer 209 may range from 5,000 to 20,000 Å for many applications.

Figure 2A:
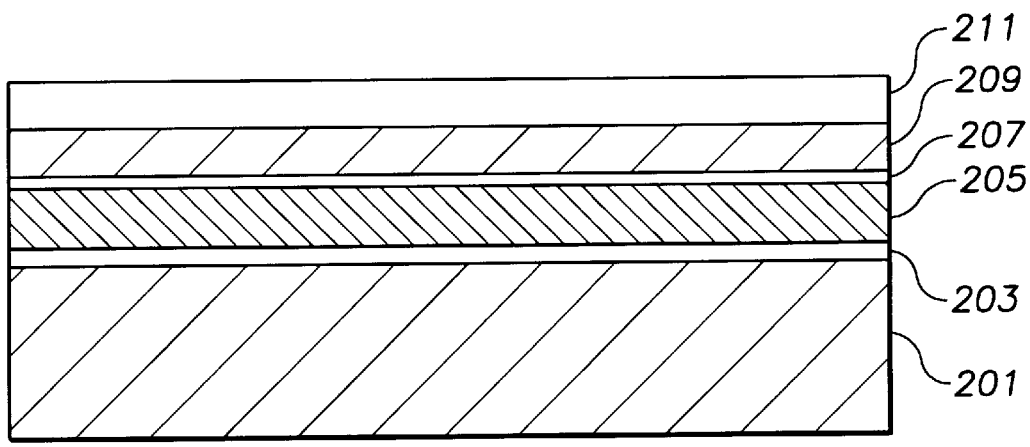
FIGS. 2A–2F illustrate an exemplary process in accordance with an embodiment of the invention.

A capping layer 211 is formed over the second substrate layer 209. The capping layer 211 may be formed from a number of different insulating materials using, for example, known deposition techniques. Suitable materials include oxides, such as silicon dioxide. The capping layer 211 may be used, at least in part, to prevent active region dopant implants into the first substrate 201 from penetrating into the second substrate layer 209. Suitable thicknesses for the capping layer 211 range from 500 to 1,000 Å for many applications. The resulting structure is illustrated in FIG. 2A.

Either before or after forming the capping layer 211, the second substrate layer 209 is provided with background dopants. Typically, the second substrate layer 209 is implanted with dopants to provide an appropriate background doping conductivity and type for the layer, to form a voltage threshold (VT) region at the base of the second substrate layer 209 near the second gate insulating layer 207, and to optionally form a punchthrough region above the voltage threshold region, (e.g., 300–500 Å from the second substrate base). Typically, the background doping and VT and punchthrough regions are formed using a dopant of a similar conductivity type. The conductivity type of dopants used in the second substrate layer 209 may be the same or different from the conductivity type of the background dopants in the first substrate 201.

Figure 2B:
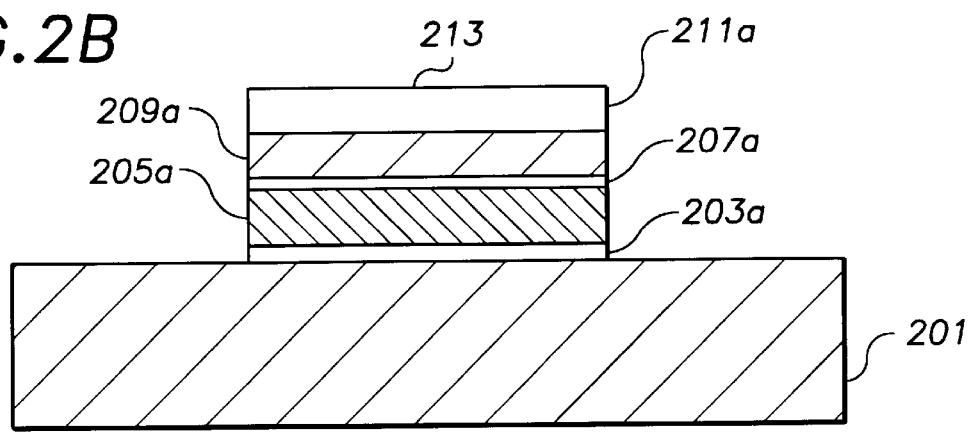

The stack of layers over the substrate 201 are then etched to form one or more stacked structures (only one of which is shown) as illustrated in FIG. 2B. The stacked layers may be etched using, for example, known photolithography and etching techniques. The stacked structure 213 generally includes a gate electrode 205a disposed between first and second gate insulating layers 203a and 207a, a second substrate 209a disposed over the second gate insulating layer 207a, and a capping layer 211a disposed over the substrate 209a. The width of the stacked structure is typically selected based on the desired width of the gate electrode 205a. Suitable widths range from 0.1 to 0.25 microns or more for many applications.

A first set of active regions 215 are formed in the substrate 201 adjacent the stacked structure 213. The active regions 215 will be used as source and drain regions and may be formed using, for example, known implantation techniques. Before, during or even after formation of the active regions 215, spacers 217 may be formed on sidewalls of the stacked structure 213. For instance, where LDD (lightly doped drain) active regions are formed, spacers may be formed after an LDD implant and before a source/drain implant to space the source/drain implant from the stacked structure 213. These spacers may then be used as the spacers 217 or, if desired, may be widened after the source/drain implant.

Figure 2C:
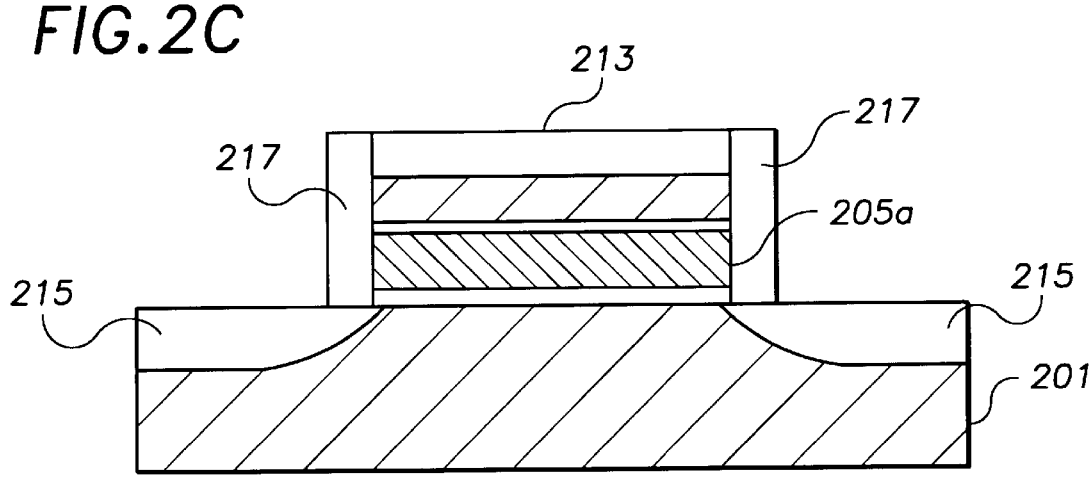

An upper portion of each spacer 217 will be removed in order to form a second, upper set of active regions associated with the gate electrode 205a. These portions of the spacers 217 are typically selectively removed while leaving the capping layer 211a intact. The material of the spacers 217 thus is suitably selected in consideration of the capping layer material. Where the capping layer 213 is formed from silicon dioxide, the spacers 217 may be formed from a nitride or an oxynitride, for example. The width of the spacers 217 will typically define the width of the second set of active regions. Suitable spacer widths range from 300 to 800 Å for many applications. The resultant structure is illustrated in FIG. 2C.

After forming the active regions 215, the semiconductor structure may be annealed to activate the dopants in the active regions 215. This anneal may also serve to activate the background dopants in the second substrate 209a, the background dopants in the substrate 201, and dopants in the gate electrode 205a, if any. Alternatively, separate anneals may be performed to activate the background dopants and any gate electrode dopants.

Figure 2D:
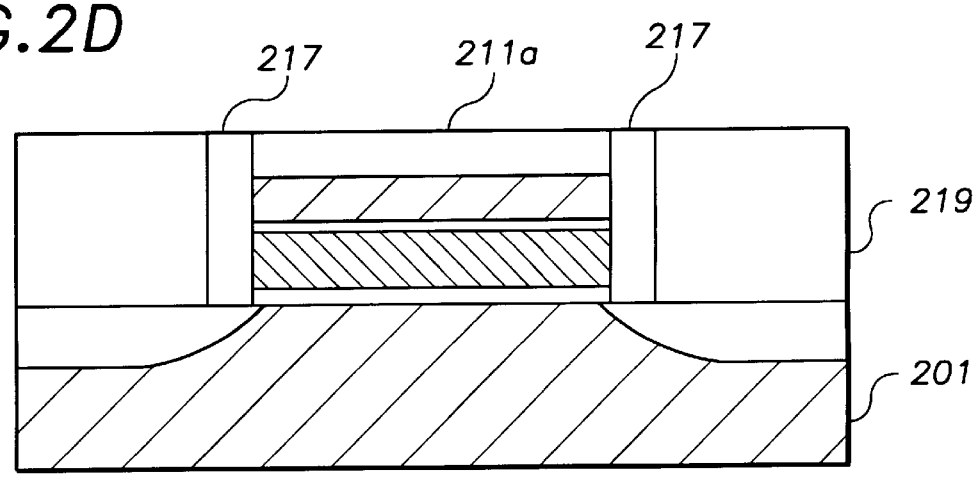

An insulating layer 219 is formed over the substrate 201 and adjacent the spacers 217, as illustrated in FIG. 2D. The insulating layer 219 is typically formed from a material which remains intact while removing portions of the spacers 217. When the spacers 217 are formed from a nitride or oxynitride, the insulating film 219 may, for example, be formed from silicon dioxide. The insulating film 219 may be formed using known techniques. For example, a layer of insulating material may be deposited over the substrate 201 and polished to expose the upper surfaces of the spacers 217 using, for example, known deposition and polishing techniques.

Figure 2E:
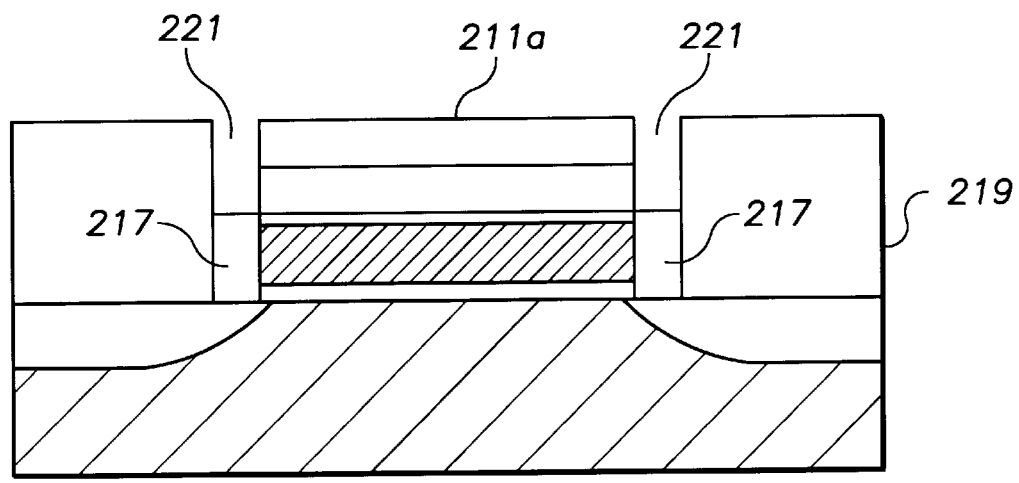

Upper portions of the spacers 217 are removed to form openings 221, as illustrated in FIG. 2E. As will be discussed below, an active region will be formed in each opening 221. The depth of the openings 221 typically extends to the second substrate layer/second gate insulating layer interface. Upper portions of the spacers 217 may be removed using a number of different etching techniques which selectively etch the spacers 217, while leaving the capping layer 211a and insulating layer 219 substantially intact. Suitable etching techniques include plasma etching, for many applications. Typically, removal of upper portions of the spacers 217 is performed using a timed etch to provide the desired depth of the openings 221.

Figure 2F:
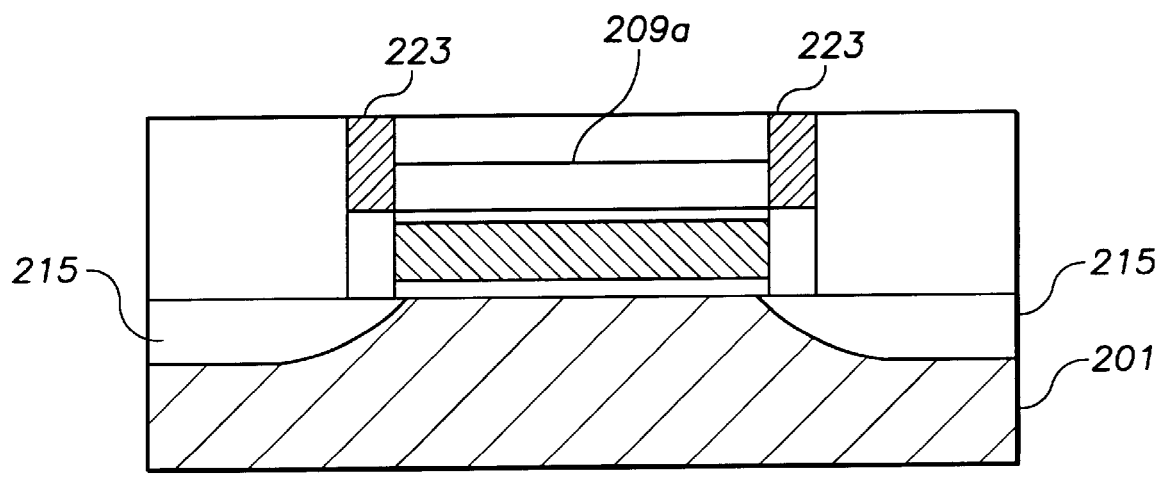

Active regions 223 are formed in the openings 221, as illustrated in FIG. 2F. The active regions 223 may be formed from a number of different conductive materials using, for example, known deposition and polishing techniques. Suitable materials include metals, such as cobalt tungsten or copper, or doped polysilicon, for many applications. The active regions 223 form a second, upper set of active regions associated with the gate electrode 205a and the second substrate 209a. Following formation of the active regions 223, contacts are typically formed to the active elements and processing continues with known fabrication steps to complete the ultimate device structure. Exemplary techniques for forming contacts to the active elements will be discussed below.

The structure depicted in FIG. 2F includes a first set of active regions 215 associated with the first substrate 201 and the gate electrode 205a and a second set of active regions 223 associated with the second substrate 209a and the gate electrode 205a. The structure depicted in FIG. 2F may be used in a number of different manners. The active regions 223, substrate 209a and gate electrode 205a may, for example, be used as a first transistor and the lower active regions 215, substrate 201 and shared gate electrode 205a may be used as a second transistor. As should be appreciated the type (e.g., n-channel or p-channel) of each transistor depends on the conductivity type of the respective channel region under a transverse electric field. The two separate transistors may be the same type or different types. The various combinations may be useful in a number of different logic devices, for example. In another embodiment, shown in FIG. 3B', an upper set of active regions 223' is coupled to a lower set active regions 215' to form a single transistor.

Using the above process, a single gate electrode may be associated with upper and lower sets of active regions. Each set of active regions and the shared gate electrode may be used as a different transistor. This can, for example, increase the density of transistors on the substrate. Alternatively, the two sets of active regions may be coupled together. This may, for example, increase the drive current of the resultant transistor device.

Figure 3A:
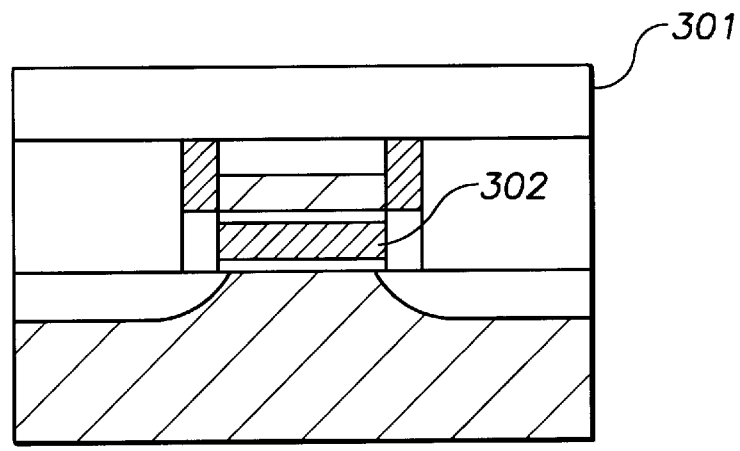
FIGS. 3A–3F and 3B' illustrate an exemplary process in accordance with another embodiment of the invention.

FIGS. 3A–3F illustrate exemplary processes for forming contacts to the active elements of the structure shown in FIG. 2F. These exemplary techniques are provided by way of reference and are not intended to limit the scope of the invention. A number of different techniques may be used to contact the active elements. In FIG. 3A, an insulating layer 301 is formed over the structure of FIG. 2F. The insulating layer 301 may be formed from a number of different materials using, for example, known deposition techniques. Suitable materials include oxides such as silicon dioxide, for many applications.

The insulating layer 301 is then selectively masked to cover a first region of the wafer in which a contact to the shared gate electrode 302 will be formed and to selectively expose portions of the layer 301 in a second region of the wafer where contacts to other active elements will be formed. This first mask may be formed using known photolithography techniques. Exposed portions of the insulating layer 301 and, where appropriate, portions of underlying layers are removed to form openings for contacts to the upper and lower active regions 303 and 305 and an upper substrate 307. This may be done using known etching techniques. Typically, this step includes etching portions of the insulating layer 301 and underlying portions of the insulating layer 309 to form openings exposing the active regions 303, etching portions of the insulating layer 301 to form openings exposing the active regions 305, and etching portions of the insulating layer 301 and underlying portions of the capping layer 311 to form an opening exposing the second substrate 307.

Figure 3B:
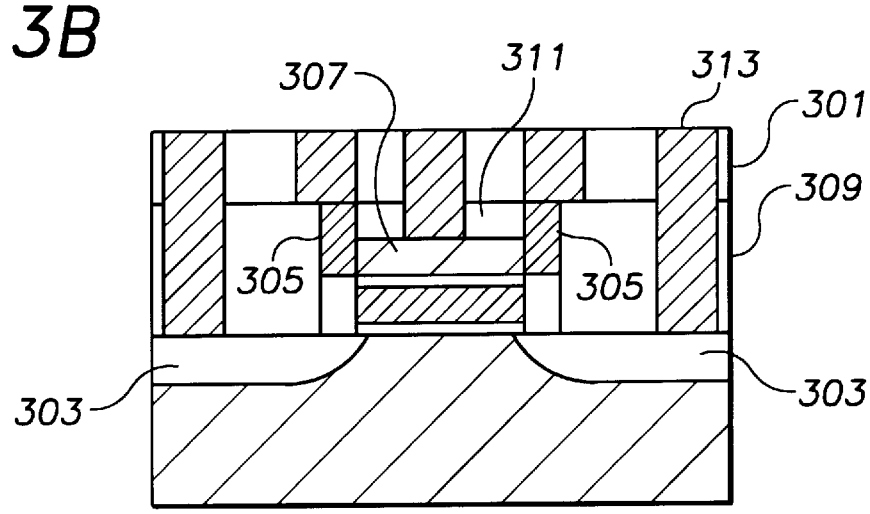
Figure 3C:
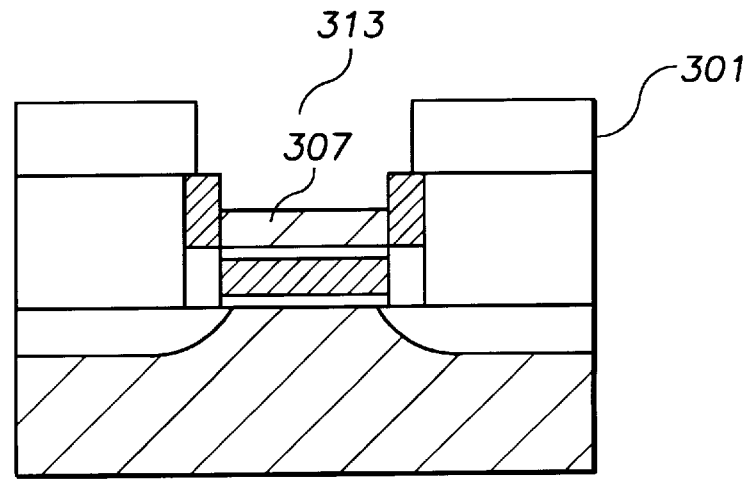
Figure 3B:
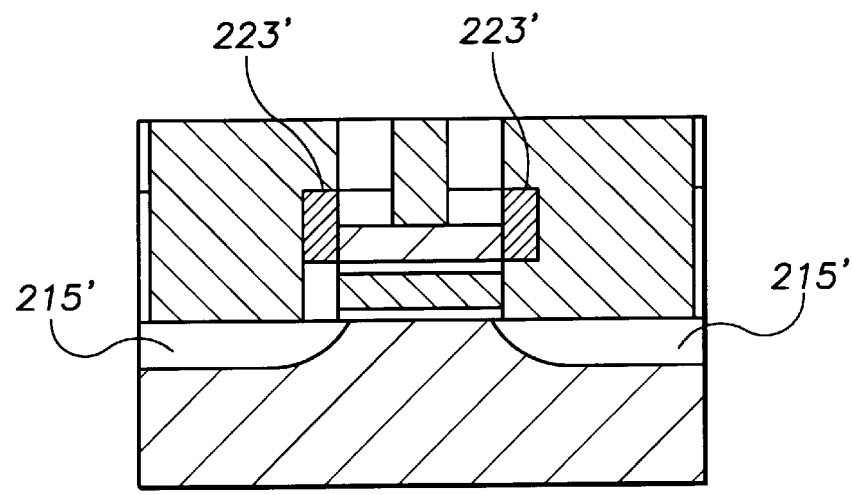

The openings are then filled with conductive material to form contacts 313 to the respective active elements. This may be done by depositing and polishing a layer of conductive material using, for example, known polishing and deposition techniques. Suitable conductive materials include, for example, metals, such as cobalt, tungsten or copper, for many applications. The resultant structure is illustrated in FIG. 3C. Where two sets of active region and are coupled, a single opening to each coupled active region may be formed and filled with conductive material, as illustrated in FIG. 3B'.

Figure 3D:
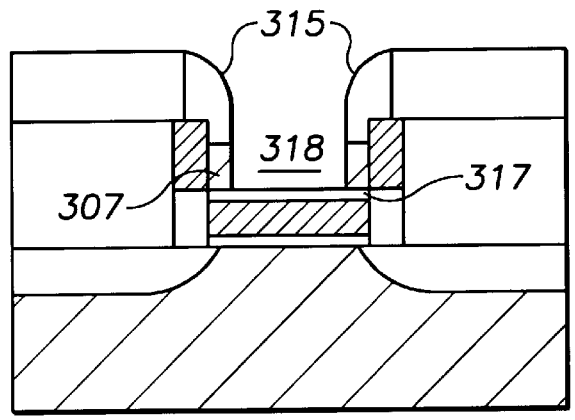

The first mask may then removed and a second patterned mask formed to cover the second region of the wafer and selectively expose a portion of the insulating layer 301 in the first region. The exposed portion of the insulating layer 301 and underlying portions of a capping layer are removed to expose a portion of the upper substrate 307. The resultant structure is illustrated in FIG. 3D. Selective removal of the insulating layer 301 and the capping layer may be performed using, for example, known etching techniques. This typically leaves an opening 313 over the upper substrate 307.

Spacers 315 are formed on sidewalls of the opening 313 using, for example, known techniques. The spacers 315 are typically formed from a material which remains intact while etching the upper substrate 307. One suitable material is nitride. Using the spacers 315 for alignment, the exposed portion of the upper substrate 307 is removed to expose a portion of the second gate insulating layer 317. The resultant structure is illustrated in FIG. 3D. Selective removal of the upper substrate portion may be performed using known etching techniques. This generally leaves an opening 318 above the second gate insulating layer 317.

Figure 3E:
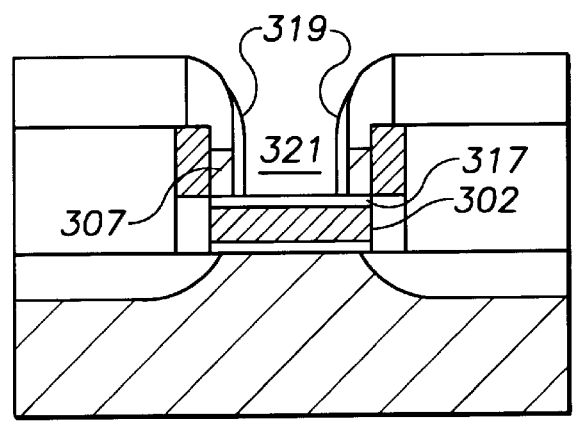

Spacers 319 are formed on sidewalls of the opening 318 using, for example, known techniques. The spacers 319 are typically formed of a material, such as nitride, which remains intact while etching the second gate insulating layer 317. The spacers 319 will be used to insulate portions of the upper substrate 307 from a conductive contact. Suitable thicknesses of the spacers 319 adjacent the upper substrate 307 range from 150 to 300 Å for many applications. While spacers 319 and 315 are illustrated separately, when formed of the same material, these spacers will typically blend together. Using the spacers 319 for alignment, an exposed portion of the second gate insulating layer 317 is removed to expose a portion of the upper surface of the gate electrode 302. Removal of the portion of the second gate insulating layer 317 may be formed using, for example, known etching techniques. This generally results in an opening 321 being formed over an exposed portion of the gate electrode 302. The resultant structure is illustrated in FIG. 3E.

Figure 3F:
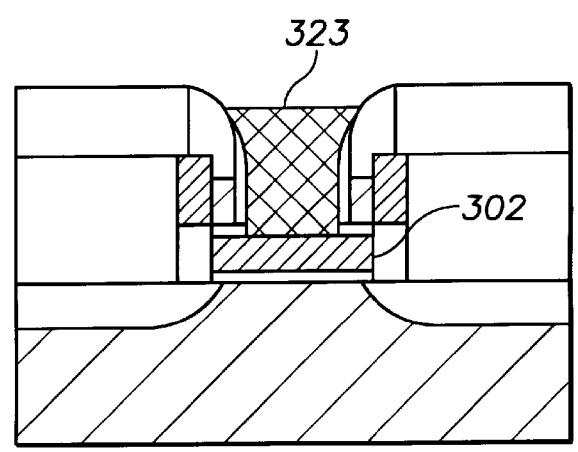

A conductive contact 323 is then formed in the opening 321, as illustrated in FIG. 3F. The conductive contact 323 may be formed from a variety of materials including metals, such as tungsten, cobalt or copper. Formation of the conductive contact 323 may be performed using, for example, known deposition and polishing techniques. In this manner, a conductive contact insulated form the upper active regions 305 and the upper substrate 307 may contact a shared gate electrode.

Figure 4:
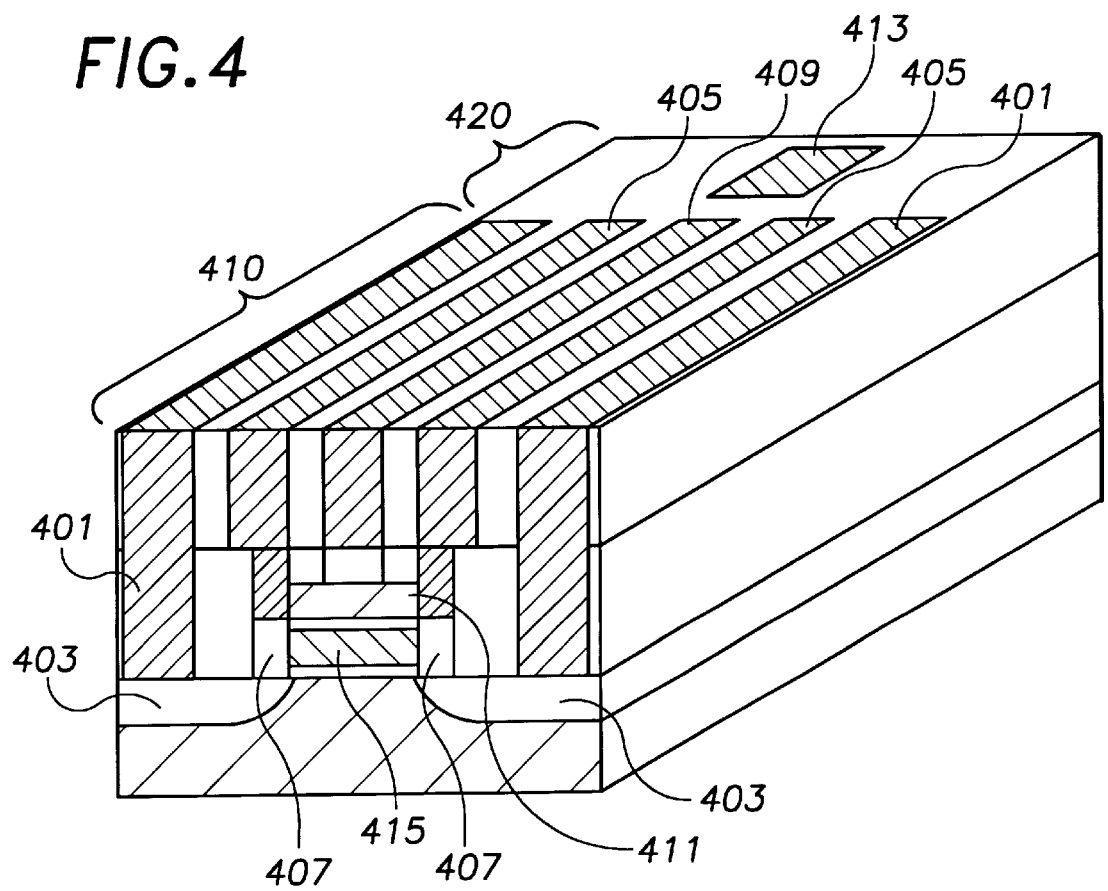
FIG. 4 illustrates an exemplary structure in accordance with yet another embodiment of the invention.

FIG. 4 illustrates an exemplary section of a wafer which may be formed with the above techniques. The wafer section includes a first region 410 with conductive contacts 401 contacting a lower pair of active regions 403, conductive contacts 405 contacting an upper active regions 407, and a conductive contact 409 contacting an upper substrate 411, and a second region 420 with a conductive contact 413 connected to a shared gate electrode 415 associated with the first set of active regions 403 and the second set of active regions 407.

The present invention is applicable to the fabrication of a number of different devices where formation of a shared gate electrode may be desirable. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:
1. A semiconductor device, comprising:
   a first substrate;
   a gate electrode disposed over the first substrate
   a second substrate disposed over the gate electrode;
   a first set of active regions disposed in portions of the first substrate adjacent the gate electrode;
   a second set of active regions disposed above the gate electrode and adjacent the second substrate;
   a first insulating layer disposed over the second substrate and between the second set of active regions; and
   a second insulating layer disposed adjacent to and in contact with each of the active regions of the second set; the second insulating layer also disposed adjacent to and in contact with at least one spacer member that is disposed beneath each active region of the second set.

2. The semiconductor device of claim 1, wherein the second substrate layer includes a voltage threshold region near a base of the second substrate layer.

3. The semiconductor device of claim 2, wherein the second substrates layer includes a punchthrough region above the voltage threshold region.

4. The semiconductor device of claim 1, further including spacers disposed on sidewalls of the gate electrode below the second set of active regions.

5. The semiconductor device of claim 1, wherein the first and second sets of active regions are coupled together.

6. The semiconductor of claim 1, wherein the gate electrode and the first set of active regions form a transistor of a first conductivity type and wherein the gate electrode and the second set of active regions form a transistor of a different conductivity type.

7. The semiconductor device of claim 1, wherein the gate electrode and the first set of active region form a transistor of a first conductivity type and wherein the gate electrode and the second set of active region form a transistor of a same conductivity type.

8. The semiconductor device of claim 1, wherein the active regions of the second set each include a top surface substantially planar with a top surface of the first insulating layer.

9. The semiconductor device of claim 8, wherein the second insulating layer includes a top surface substantially planar with the top surface of the first insulating layer and the top surfaces of the second set of active regions.

10. The semiconductor device of claim 1, wherein the spacer is formed from a material which is selectively etchable relative to the first and second insulating layers.

11. The semiconductor device of claim 1, further including one or more contacts disposed in the first insulating layer and in contact with one or more of the active regions of the first and second sets.

12. The semiconductor device of claim 1, further including a contact extending through the second insulating layer and the second substrate and in contact with the gate electrode.

13. The semiconductor device of claim 12, further including an insulator disposed between the contact and the second substrate.

14. The semiconductor device of claim 13, wherein the insulator is formed from a nitride.

15. The semiconductor device of claim 1, further including a first gate insulating layer disposed between the gate electrode and the first substrate and a second gate insulating layer disposed between the gate electrode and the second substrate.

16. The semiconductor device of claim 15, wherein each active region of the second set includes a bottom surface on top of an underlying spacer and proximate an interface between the second gate insulating layer and the gate electrode.

17. The semiconductor device of claim 16, wherein each active region of the second set has a width substantially equivalent to a width of the respective underlying spacer.

18. A semiconductor device, comprising:

a first substrate;

a stack disposed over the first substrate and including:
   first gate insulating layer disposed over the first substrate;
   a gate electrode disposed over the first gate insulating layer
   a second gate insulating layer disposed over the gate electrode
   a second substrate disposed over the second gate insulating layer;

spacers disposed on sidewalls of the stack, each spacer having a top surface above the gate electrode;

a first set of active regions disposed in portions of the first substrate adjacent the gate electrode a second set of active regions disposed on top of the spacers and adjacent the second substrate, wherein each active region of the second set has a width similar to a width of an underlying one of the spacers;

a first insulating layer disposed over the second substrate and between the second set of active regions; and a second insulating layer disposed adjacent to and in contact with each of the active regions of the second set; the second insulating layer also disposed adjacent to and in contact with at least one of the spacers.

19. The semiconductor device of claim 18, wherein the second substrate layer includes a voltage threshold region near a base of the second substrate layer and a punchthrough region above the voltage threshold region.

20. The semiconductor device of claim 18, wherein the gate electrode and the first set of active regions form a transistor of a first conductivity type and wherein the gate electrode and the second set of active regions form a transistor of a different conductivity type.

21. The semiconductor device of claim 18, wherein the gate electrode and the first set of active regions form a transistor of a first conductivity type and wherein the gate electrode and the second set of active regions form a transistor of a same conductivity type.

22. The semiconductor device of claim 18, wherein the stack further includes a capping layer disposed over the second substrate and between the second set of active regions.

* * * * *

UNITED STATES PATENT AND TRADEMARK OFFICE
CERTIFICATE OF CORRECTION

PATENT NO.     : 6,177,687 B1
DATED          : January 23, 2001
INVENTOR(S)    : Gardner et al.

It is certified that error appears in the above-identified patent and that said Letters Patent is hereby corrected as shown below:

Drawings,
FIG. 3B' should include a spacer on the left-hand side of the drawing symmetrical to the one on the right side.

Column 1,
Line 11, "as" should read -- a --.

Column 3,
Line 10, after "formed", please insert -- from --.
Line 30, after "example", please insert -- , --.
Line 47, "5000" should read -- 5,000 --.
Line 47, "10000" should read -- 10,000 --.
Lines 52-53, "silicone" should read -- silicon --.

Column 9,
Line 16, after "electrode", please insert -- ; --.

Signed and Sealed this

Eighth Day of October, 2002

Attest:

JAMES E. ROGAN
Attesting Officer     Director of the United States Patent and Trademark Office